(12) United States Patent
Li (10) Patent No.: US 10,446,632 B2
(45) Date of Patent: Oct. 15, 2019

(54) ORGANIC LIGHT-EMITTING DIODE DISPLAY PANEL

(71) Applicant: Wuhan China Star Optoelectronics Semiconductor Display Technology Co., Ltd., Wuhan, Hubei (CN)

(72) Inventor: Peng Li, Guangdong (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/938,997

(22) Filed: Mar. 28, 2018

(65) Prior Publication Data

US 2019/0206962 A1 Jul. 4, 2019

Related U.S. Application Data

(63) Continuation of application No. PCT/CN2018/072697, filed on Jan. 15, 2018.

(30) Foreign Application Priority Data

Dec. 28, 2017 (CN) .......................... 2017 1 1462637

(51) Int. Cl.
*H01L 27/32* (2006.01)
*H01L 51/52* (2006.01)
(Continued)

(52) U.S. Cl.
CPC ....... *H01L 27/3262* (2013.01); *G09G 3/3208* (2013.01); *H01L 27/3265* (2013.01);
(Continued)

(58) Field of Classification Search
CPC ..... H01L 51/0512; H01L 51/52; H01L 51/56; H01L 27/3262; H01L 27/3265
See application file for complete search history.

(56) References Cited

U.S. PATENT DOCUMENTS

2005/0041169 A1* 2/2005 Hashimoto ........... G02F 1/1368
349/43
2015/0206907 A1 7/2015 Hsu et al.
2017/0194401 A1* 7/2017 Cho ................... H01L 29/78618

FOREIGN PATENT DOCUMENTS

CN 1375733 A 10/2002
CN 102655175 A 9/2012
(Continued)

*Primary Examiner* — Christine A Enad
(74) *Attorney, Agent, or Firm* — Hemisphere Law, PLLC; Zhigang Ma (57) ABSTRACT

An organic light emitting diode display panel is disclosed, including a TFT and a metal layer located on a gate insulating layer of the TFT, the metal layer includes a first metal portion configured to transmit a direct current signal and a second metal portion facing a gate of the TFT and forms a storage capacitor. The first metal portion includes a first side surface facing the second metal portion, the first side surface includes a first notch covered by a vertical projection of the second metal portion on the first side surface. The first notch increases a distance between the first and the second metal portions and only partially reduces the size of the first metal portion to prevent the first metal portion from being narrow and easily broken, thereby reducing the possibility of short circuit or open circuit of the first and the second metal portions.

10 Claims, 5 Drawing Sheets

(51) Int. Cl.
  *H01L 51/56* (2006.01)
  *H01L 51/05* (2006.01)
  *G09G 3/3208* (2016.01)

(52) U.S. Cl.
  CPC .......... *H01L 51/0512* (2013.01); *H01L 51/52* (2013.01); *H01L 51/56* (2013.01)

(56) References Cited

FOREIGN PATENT DOCUMENTS

| | | |
|---|---|---|
| CN | 105161544 A | 12/2015 |
| CN | 105575974 A | 5/2016 |
| CN | 107452766 A | 12/2017 |

* cited by examiner

ORGANIC LIGHT-EMITTING DIODE DISPLAY PANEL

RELATED APPLICATIONS

This application is a continuation application of PCT Patent Application No. PCT/CN2018/072697, filed Jan. 15, 2018, which claims the priority benefit of Chinese Patent Application No. 201711462637.2, filed Dec. 28, 2017, which is herein incorporated by reference in its entirety.

FIELD OF THE DISCLOSURE

The disclosure relates to the technical field of display devices, and in particular to an organic light emitting diode display panel.

BACKGROUND

The organic light emitting diode (OLED) is a kind of diodes to achieve an organic semiconductor material with a reversible color change produced in the driving current. The basic structure of an organic light emitting diode display device generally includes a hole transport layer, a light-emitting layer, and an electron transport layer. When the power is supplied at an appropriate voltage, the holes of the anode and the electrons of the cathode are combined in the light-emitting layer to generate a bright light. Compared with thin-film field effect transistor liquid crystal displays, organic light emitting diode display devices has characteristics of high visibility and high brightness and is more power, light weight, thin thickness. Therefore, organic light emitting diode display devices are considered one of the most promising products in the 21st century.

In the prior art, a second metal layer is deposited on the gate insulating layer, and two metal portions are separated from each other after exposing and etching the second metal layer and are respectively transmit different electrical signals, such as a gate reset signal and a pixel positive power signal. With consumers increasing demands of resolution of the organic light emitting diode display, high-density pixel design density of the organic light emitting diode display panel thin film transistor (TFT) is increasing, design of high-density pixels makes the density of the thin film transistor in the organic light emitting diode display panel is increasing; and the size and spacing of the two metal portions formed after the metal layer is exposed and etched become smaller and smaller, which increases the manufacturing difficulty and easily causes defects such as short circuit or open circuit.

SUMMARY

A technical problem to be solved by the disclosure is to provide an OLED display panel, configured to solve the problem of short circuit or open circuit inside the OLED display panel with high density pixel design in the prior art.

To solve the technical problem, the disclosure provides an organic light emitting diode display panel, including:
 a thin film transistor; and
 a metal layer, located on the gate insulating layer of the thin film transistor, and the metal layer includes a first metal portion and a second metal portion separated from each other, the first metal portion is configured to transmit a direct current signal, and the second metal portion faces a gate of the thin film transistor and forms a storage capacitor;

the first metal portion includes a first side surface facing the second metal portion, the first side surface includes a first notch, and a vertical projection of the second metal portion on the first side surface covers the first notch.

The second metal portion includes a second side surface facing the first metal portion and a third surface side and a fourth side surface of both opposite sides connecting to the first side surface; a minimum distance between a vertical projection of the first notch on the second side surface and the third side surface is greater than 1 um and a minimum distance between a vertical projection of the first notch on the second side surface and the fourth side surface is greater than 1 um.

The minimum distance between the vertical projection of the first notch on the second side surface and the third side surface is equal to the minimum distance between the vertical projection of the first notch on the second side surface and the fourth side surface.

The first notch has a depth from 0.1 to 0.3 um.

The second side surface includes a second notch, and a vertical projection of the first metal portion on the second side surface covers the second notch.

A minimum distance between the second notch and the third side surface is greater than 1 um, and a minimum distance between the second notch and the fourth side surface is greater than 1 um.

A minimum distance between the second notch and the third side surface is equal to a minimum distance between the second notch and the fourth side surface.

A vertical projection of the second notch on the first side surface coincides with the first notch.

A sum of a depth of the first notch and a depth of the second notch is from 0.1 to 0.3 um.

The depth of the first notch is the same as the depth of the second notch.

The first metal portion is strip-shaped, and the second metal portion is square.

The first metal portion is square, and the second metal portion is strip-shaped.

The first metal portion and the second metal portion are simultaneously formed by the metal layer after exposing, developing, and etching.

The beneficial effects of the disclosure are as follows: the first metal portion and the second metal portion are formed in the same metal layer, the first notch is located at a position of the first metal portion facing the second metal portion, increasing the distance between the first metal portion and the second metal portion, thereby avoiding short circuit of the first metal portion and the second metal portion; meanwhile, the first metal portion only partially reduces the size of the first metal portion so as to prevent the first metal part from being narrow and easily broken, thereby reducing the possibility of short circuit or open circuit of the first portion and the second portion and enhancing the yield of the organic light emitting diode display panel.

BRIEF DESCRIPTION OF THE DRAWINGS

In order to illustrate technical schemes of the disclosure or the prior art more clearly, the following section briefly introduces drawings used to describe the embodiments and prior art. Obviously, the drawing in the following descriptions is just some embodiments of the disclosure. The ordinary person in the related art can acquire the other drawings according to these drawings without offering creative effort.

DETAILED DESCRIPTION OF PREFERRED EMBODIMENTS

The following sections offer a clear, complete description of the disclosure in combination with the embodiments and accompanying drawings. Obviously, the embodiments described herein are only a part of, but not all of the embodiments of the disclosure. In view of the embodiments described herein, any other embodiment obtained by those of ordinary skill in the art skilled in this art without offering creative effort is included in a scope claimed by the present invention.

Figure 1:
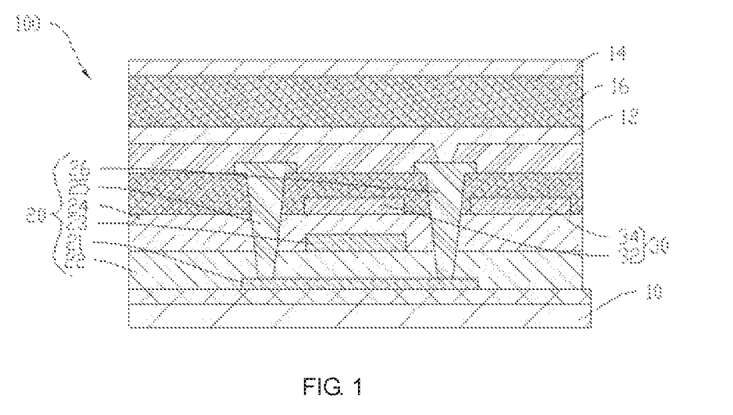
FIG. 1 is a schematic view of a stacked structure of an organic light emitting diode display panel according to a first embodiment of the disclosure.

Referring to FIG. 1, a light emitting diode display panel 100 according to a first embodiment of the disclosure includes a substrate 10, a thin film transistor 20, an anode layer 12, a light emitting layer 16, a cathode layer 14, and the like sequentially stacked. The substrate 10 has a certain intensity, configured to carry the thin film transistor 20, the anode layer 12, the light emitting layer 16, and the cathode layer 14, and other structures. The anode layer 12 and the cathode layer 14 are configured to drive the light emitting layer 16 to emit light to form an image. The thin film transistor 20 is electrically connected to the anode layer 12 so as to control the potential of the anode layer 12.

Figure 2:
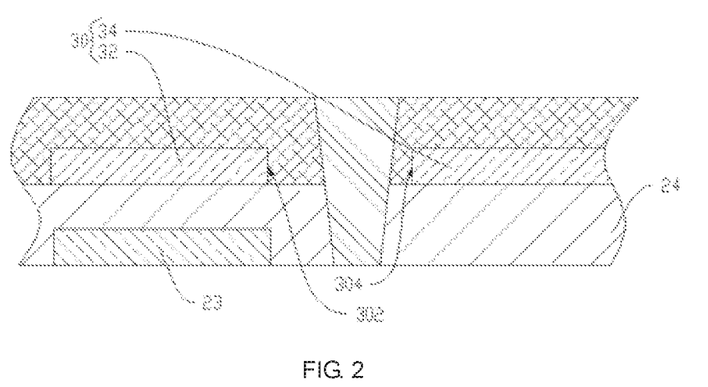
FIG. 2 is a partially enlarged schematic view of the stacked structure of the organic light emitting diode display panel according to the first embodiment of the disclosure.

Referring to FIGS. 1 and 2, in the order of the process, the thin film transistor 20 includes an active layer 21, a first insulating layer 22, a gate 23, a gate insulating layer 24, a source 25, a drain 26, and the like; the source 25 and the drain 26 are electrically connected through the active layer 21. The gate 23 is configured to control unidirectional conduction of the active layer 21. The first insulating layer 22 is configured to isolate the active layer 21 from the gate 23. The gate insulating layer 24 is configured to isolate the gate 23 from the source 25 and the drain 26. In this embodiment, a metal layer 30 is further disposed on the gate 23 of the thin film transistor 20. The metal layer 30 includes a first metal portion 32 and a second metal portion 34 separated from each other. Specifically, a gap is disposed between the first metal portion 32 and the second metal portion 34; referring to FIG. 3, in an embodiment, the first metal portion 32 is strip-shaped, the second metal portion 34 is square, a size of the gap between the first metal portion 32 and the second metal portion 34 is S1; in other words, a spacing between the first metal portion 32 and the second metal portion 34 is S1. In this embodiment, the first metal portion 32 and the second metal portion 34 are both electrically connected to the driving circuit, and the first metal portion 32 is configured to transmit a direct current signal, such as a gate reset signal Vref, and the second metal portion 34 faces a gate 23 of the thin film transistor 20 to form a storage capacitor Cst to function to protect the potential of the gate 23. In this embodiment, the size of a width dimension of the first metal portion 32 with a strip-shaped shape is L1, and the second metal portion 34 is located on a side of the width dimension direction of the first metal portion 32.

Figure 3:
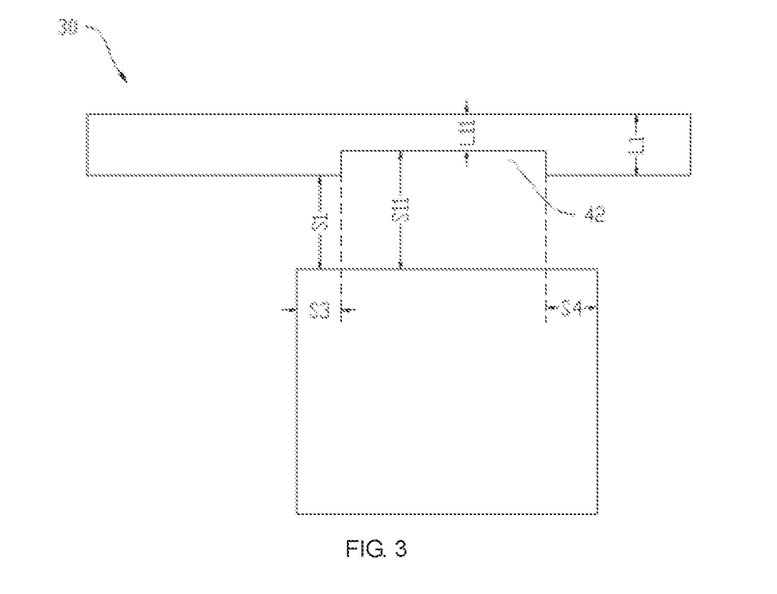
FIG. 3 is a top view of a metal layer of the organic light emitting diode display panel according to the first embodiment of the disclosure.

Referring to FIGS. 2 and 3, a first metal portion 32 includes a first side surface 302 facing the second metal portion 34, the first side surface 302 includes a first notch 42, and a vertical projection of the second metal portion 34 on the first side surface 302 covers the first notch 42. In this embodiment, the first metal portion 32 and the second metal portion 34 are formed by the metal layer 30 after exposing, developing, and etching. The shapes and sizes of the first metal portion 32 and the second metal portion 34 depend on the corresponding pattern of a mask plate used in the exposure process; correspondingly, a compensation pattern is designed on the mask plate, after exposing by the mask plate, a first notch 42 corresponding to the compensation pattern is formed in the first metal portion 32. Specifically in FIG. the first notch 42 faces the second metal portion 34, thereby increasing the spacing S11 between the first metal portion 32 and the second metal portion 34, S11 is greater than S1, thereby increasing the spacing between the first metal portion 32 and the second metal portion 34 and reducing the risk when the first metal portion 32 and the second metal portion 34 is easily come into contact with each other and become short-circuited due to too small spacing. Further, the width dimension of the first metal portion 32 at the position of the first notch 42 is L11, L11 is less than L1, and L1−L11=S11−S1. In other words, the reduction of the width dimension of the first metal portion 32 is equal to the addition of the spacing between the first metal portion 32 and the second metal portion 34. The first notch 42 is located only at the position of the first metal portion 32 facing the second metal portion 34 without reducing the overall width dimension of the first metal portion 32, and the first metal portion 32 with an elongated shape still maintains a good structure stability, that is, the first metal portion 32 is not easily broken, thereby reducing the risk of open circuit of the first metal portion 32.

The first metal portion 32 and the second metal portion 34 are formed in the same metal layer 30. The first notch 42 is located at a position of the first metal portion 32 facing the second metal portion 34, increasing the distance between the first metal portion 32 and the second metal portions 34, thereby avoiding the short circuit of the first metal portion 32 and the second metal portion 34; simultaneously, the first notch 42 only partially reduces the size of the first metal portion 32, to prevent the first metal portion 32 from being narrow as a whole and being easily broken, thereby reducing the possibility of short circuit or open circuit of the first metal portion 32 and the second metal portion 34, thereby improving the yield of the organic light emitting diode display panel 100.

Referring to FIGS. 2 and 3, in this embodiment, the second metal portion 34 includes a second side surface 304 facing the first metal portion 32 and a third side surface 306 and a fourth side surface 308 connecting to both opposite sides of the first side surface 302; specifically in FIG. 3, a minimum distance between a vertical projection of the first notch 42 on the second side surface 304 and the third side surface 306 is greater than 1 um, and a minimum distance between the vertical projection of the first notch 42 on the second side surface 304 and the fourth side is greater than 1 um. In this embodiment, the second metal portion 34 is square, the third side surface 306 and the fourth side surface 308 are two opposite side surfaces, and the first side surface 302 is connected between the third side surface 306 and the fourth side surface 308. Further, the vertical projection of the first notch 42 on the second side surface 304 includes an end near the third side surface 306, and a distance between the end and the third side surface 306, that is, a minimum distance of the vertical projection of the first notch 42 on the second side surface 304 and the third side surface 306 is S3; the vertical projection of the first notch 42 on the second side surface 304 includes an end near the fourth side surface 308, and a distance between the end near the fourth side surface 308 and the fourth side surface 308 is the minimum distance S4 between the vertical projection of the first notch 42 on the second side surface 304 and the fourth side surface 308. In this embodiment, S3 is greater than 1 um, S4 is greater than 1 um, a size of the vertical projection of the first notch 42 on the second side surface 304 is smaller than a size of the second side surface so as to avoid the size of the first notch 42 being large to affect the ability of transmit signals of the first metal portion 32, for example, to avoid the problem of excessive resistance of the first metal portion 32.

Continuing to refer to FIG. 3, in one embodiment, the minimum distance between a vertical projection of the first notch 42 on the second side surface 304 and the third side surface 306 is equal to the minimum distance between a vertical projection of the first notch 42 on the second side surface 304 and the fourth side surface 308, in other words, S3=S4. Specifically, the vertical projection of the first notch 42 on the second side surface 304 is located at the center of the second side surface 304, increasing the minimum distance between the first metal portion 32 and the second metal portion 34 and preventing the first metal portion 32 from being short-circuited to the second metal portion 34.

Continuing to refer to FIG. 3, in this embodiment, a depth of the first notch 42 is from 0.1 to 0.3 um, in one embodiment, the depth of the first notch 42 is 0.2 um, the first notch 42 increases the distance between the first metal portion 32 and the second metal portion 34 to prevent the first metal portion 32 from being short-circuited to the second metal portion 34; meanwhile, the first notch 42 only partially reduces the size of the first metal portion 32 to prevent the width dimension of the first metal portion 32 from being narrow as a whole and easily broken, thereby reducing the possibility of short circuit or open circuit of the first metal portion 32 and the second metal portion 34 and enhancing the yield of the organic light emitting diode display panel 100.

Figure 4:
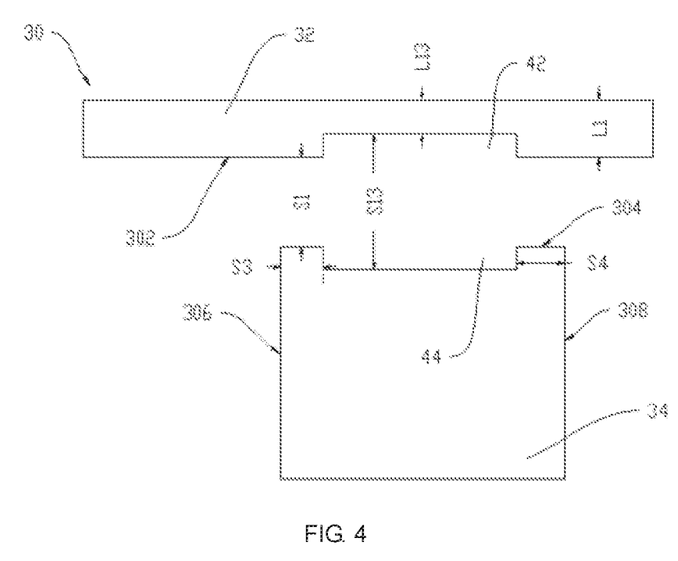
FIG. 4 is a top view of a metal layer of an organic light emitting diode display panel according to a second embodiment of the disclosure.

Referring to FIG. 4, the organic light emitting diode display panel 100 provided in the second embodiment of the disclosure differs from the first embodiment in that the second side surface 304 includes a second notch 44, and a vertical projection of the first metal portion 32 on the second side surface 304 covers the second notch 44. In this embodiment, the first metal portion 32 and the second metal portion 34 are formed after the metal layer 30 is formed by exposing, developing, etching, or the like. The shapes and sizes of the first metal portion 32 and the second metal portion 34 depend on a corresponding pattern of a mask plate used in the exposure process; correspondingly, a compensation pattern is designed on the mask plate, after exposing by the mask plate, a first notch 42 corresponding to the compensation pattern is formed in the first metal portion 32, and a second notch 42 corresponding to the compensation pattern is formed in the second metal portion 34. Specifically, the first notch 42 faces the second metal portion 34, and the second notch 44 faces the first metal portion 32, thereby increasing the spacing S13 between the first metal portion 32 and the second metal portion 34, and S13 is larger than S1 so as to increase the spacing between the first metal portion 32 and the second metal portion 34 and to reduce the risk when the first metal portion 32 and the second metal portion 34 is easily come into contact with each other and become short-circuited due to too small spacing. Further, the width dimension of the first metal portion 32 at the position of the first notch 42 is L13 and L13 is less than L1 In an embodiment, the depth of the first notch 42 is the same as the depth of the second notch 44, (L1−L13)*2=S13−S1, in other words, the reduction amount of the width dimension of the first metal portion 332 and the second metal portion 34 is equal to the addition amount of the spacing between the first metal portion 32 and the second metal portion, the first notch 42 is located only at the position of the first metal portion 32 facing the second metal portion 34 without reducing the overall width dimension of the first metal portion 32. The first metal portion 32 with an elongated shape still maintains good structural stability and the second notch 44 is located only at the position of the second metal portion 34 facing the first metal portion 32 without reducing the overall width dimension of the second metal portion 34, the second metal portion 34 with an square shape still maintains good structural stability, that is, the second metal portion 34 is not easily broken, reducing the risk of open circuit of the first metal portion 32 or the second metal portion 34.

The first metal portion 32 and the second metal portion 34 are formed in the same metal layer 30, the first notch 42 is located at a position of the first metal portion 32 facing the second metal portion 34, and the second notch 44 is located at the position of the second metal portion 34 facing the first metal portion 32, increasing the distance between the first metal portion 32 and the second metal portion 34 so as to prevent the first metal portion 32 and the second metal portion 34 from being short-circuited; meanwhile, the first notch 42 only partially reduces the size of the first metal portion 32 to prevent the width dimension of the first metal portion 32 from being narrow as a whole and easily broken, thereby reducing the possibility of short circuit or open circuit of the first metal portion 32 and the second metal portion 34 and enhancing the yield of the organic light emitting diode display panel 100.

Continuing to refer to FIG. 4, in this embodiment, the minimum distance between the second notch 44 and the third side surface 306 is greater than 1 um, and the minimum distance between the second notch 44 and the fourth side surface 308 is greater than 1 um. In this embodiment, the second metal portion 34 is square, the third side surface 306 and the fourth side surface 308 are two opposite side surfaces, and the first side surface 302 is connected between the third side surface 306 and the fourth side surface 308. Further, the distance between an end of the second notch 44 near the third side surface 306 and the third side surface 306 is a minimum distance S3 between the first notch 42 and the third side surface S3; the distance between an end of the second notch 44 near the fourth side surface 308 and the fourth side surface 308 is a minimum distance S4 between the second notch 44 and the fourth side surface 308. In this embodiment, S3 is greater than 1 um, S4 is greater than 1 um, the size of the second notch 44 is smaller than that of the second side surface 304, so as to avoid the size of the second notch 44 being large to affect the ability of transmit signals of the first metal portion 32, for example, to avoid the problem of excessive resistance of the second metal portion 34.

Continuing to refer to FIG. 4, in an embodiment, a minimum distance between the second notch 44 and the third side surface 306 is equal to a minimum distance between the second notch 44 and the fourth side surface 308, in other words, S3=S4. Specifically, the second notch 44 is located at the center of the second side surface 304, increasing the minimum distance between the first metal portion 32 and the second metal portion 34 so as to prevent the first metal portion 32 and the second metal portion 34 from being short-circuited.

Referring to FIG. 4, in an embodiment, the vertical projection of the second notch 44 on the first side surface 302 coincides with the first notch 42; in other words, the first notch 42 faces the second notch 44, and the width dimension of the first notch 42 is the same as that of the second notch 44, thereby making the spacing between the first metal portion corresponding to the first notch 42 and the second notch 44 and the second metal portion 34 the maximum and preventing the first metal portion 32 and the second metal portion 34 from being short-circuited.

Continuing to refer to FIG. 4, in this embodiment, a sum of a depth of the first notch and a depth of the second notch 42 is from 0.1 to 0.3 um. In one embodiment, the sum of the depths of the first notch 42 and the second notch 44 is 0.2 um, the first notch 42 and the second notch 44 increase the distance between the first metal portion 32 and the second metal portion 34 and prevent the first metal portion 32 from being short-circuited to the second metal portion 34; meanwhile, the first notch 42 only partially reduces the size of the first metal portion 32 to prevent the width dimension of the first metal portion 32 from being narrow as a whole and easily broken, thereby reducing the possibility of short circuit or open circuit of the first metal portion 32 and the second metal portion 34 and enhancing the yield of the organic light emitting diode display panel 100. In an embodiment, the depth of the first notch 42 is the same as the depth of the second notch 44, that is, the depths of the first notch 42 and the second notch 44 are both from 0.05 to 0.15 um. The depth of the first notch 42 is the same as the depth of the second notch 44 so as to prevent the notch depth of the first metal portion 32 or the second metal portion 34 from being too large to affect the structural stability of the first metal portion 32 or the second metal portion 34, both the first metal portion 32 and the second metal portion 34 are not easily broken to cause an open circuit.

Figure 5:
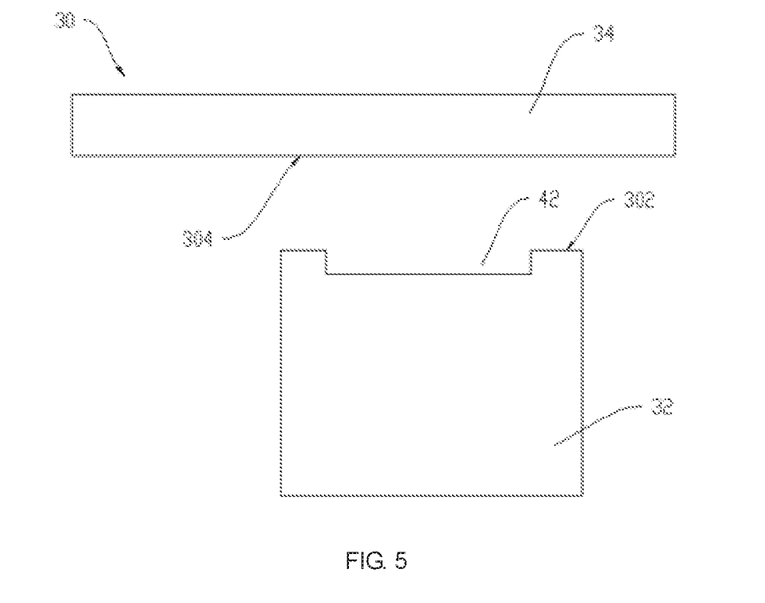
FIG. 5 is a top view of a metal layer of an organic light emitting diode display panel according to a third embodiment of the disclosure.

Referring to FIG. 5, the organic light emitting diode display panel 100 provided in the third embodiment of the disclosure differs from the first embodiment in that the second metal portion 34 is strip-shaped, the first metal portion 32 is square, and both the first metal portion 32 and the second metal portion 34 are electrically connected to the driving circuit. The second metal portion 34 is configured to transmit a direct current signal such as the gate reset signal Vref. The first metal portion 32 faces the gate 23 of the thin film transistor 20 and forms a storage capacitor Cst, so as to function to protect the potential of the gate 23. In this embodiment, the second metal portion 34 is located on one side of the width direction of the first metal portion 32.

The first metal portion 32 and the second metal portion 34 are formed in the same metal layer 30. The first notch 42 is located at a position of the first metal portion 32 facing the second metal portion 34, increasing the distance between the first metal portion 32 and the second metal portion 34 so as to prevent the first metal portion 32 and the second metal portion 34 from being short-circuited; meanwhile, the first notch 42 only partially reduces the size of the first metal portion 32 to prevent the width dimension of the first metal portion 32 from being narrow as a whole and easily broken, thereby reducing the possibility of short circuit or open circuit of the first metal portion 32 and the second metal portion 34 and enhancing the yield of the organic light emitting diode display panel 100.

The above disclosure is only several preferred embodiments of the disclosure, and certainly cannot be used to limit the scope of the disclosure. Persons skilled in the art may understand that all or part of the processes for implementing the foregoing embodiments may be implemented, equivalent changes to the requirements are still covered by the application.

What is claimed is:

1. An organic light emitting diode display panel, comprising:
    a thin film transistor; and
    a metal layer, located on a gate insulating layer of the thin film transistor;
    wherein the metal layer comprises a first metal portion and a second metal portion separated from each other, the first metal portion is configured to transmit a direct current signal, and the second metal portion faces a gate of the thin film transistor and forms a storage capacitor;
    wherein the first metal portion comprises a first side surface facing the second metal portion, a first notch is centered on the first side surface, and a vertical projection of the second metal portion on the first side surface covers the first notch;
    wherein the second metal portion comprises a second side surface facing the first metal portion and a third surface side and a fourth side surface respectively connecting to opposite sides of the first side surface, a second notch is centered on the second side surface, and a vertical projection of the first metal portion on the second side surface covers the second notch.

2. The organic light emitting diode display panel according to claim 1, wherein a minimum distance between a vertical projection of the first notch on the second side surface and the third side surface is greater than 1 um, and a minimum distance between a vertical projection of the first notch on the second side surface and the fourth side surface is greater than 1 um.

3. The organic light emitting diode display panel according to claim 2, wherein a minimum distance between the second notch and the third side surface is greater than 1 um, and a minimum distance between the second notch and the fourth side surface is greater than 1 um.

4. The organic light emitting diode display panel according to claim 3, wherein a minimum distance between the second notch and the third side surface is equal to a minimum distance between the second notch and the fourth side surface.

5. The organic light emitting diode display panel according to claim 2, wherein a vertical projection of the second notch on the first side surface coincides with the first notch.

6. The organic light emitting diode display panel according to claim 2, wherein a sum of a depth of the first notch and a depth of the second notch is from 0.1 to 0.3 um.

7. The organic light emitting diode display panel of claim 6, wherein the depth of the first notch is the same as the depth of the second notch.

8. The organic light emitting diode display panel according to claim 1, wherein the first metal portion is strip-shaped, and the second metal portion is square.

9. The organic light emitting diode display panel according to claim 1, wherein the first metal portion is square, and the second metal portion is strip-shaped.

10. The organic light emitting diode display panel according to claim 1, wherein the first metal portion and the second metal portion are simultaneously formed by the metal layer after exposing, developing, and etching.

* * * * *